United States Patent
Zhu et al.

(10) Patent No.: US 11,552,536 B2
(45) Date of Patent: Jan. 10, 2023

(54) ELECTRIC MOTOR AND INVERTER ASSEMBLY

(71) Applicant: Robert Bosch GmbH, Stuttgart (DE)

(72) Inventors: Tao Zhu, Shanghai (CN); Yanlin Li, Shanghai (CN); Xinhua Liu, Shanghai (CN); Takashi Shigematsu, Shanghai (CN); Heinz-Bernd Haiser, Shanghai (CN); Peter Ropertz, Shanghai (CN); Ralf Schmid, Shanghai (CN); Shi Deng, Shanghai (CN)

(73) Assignee: Robert Bosch GmbH, Stuttgart (DE)

( * ) Notice: Subject to any disclaimer, the term of this patent is extended or adjusted under 35 U.S.C. 154(b) by 267 days.

(21) Appl. No.: 16/647,596

(22) PCT Filed: Sep. 18, 2017

(86) PCT No.: PCT/CN2017/102038
§ 371 (c)(1),
(2) Date: Mar. 16, 2020

(87) PCT Pub. No.: WO2019/051823
PCT Pub. Date: Mar. 21, 2019

(65) Prior Publication Data
US 2020/0280238 A1  Sep. 3, 2020

(51) Int. Cl.
*H02K 5/20* (2006.01)
*H05K 7/20* (2006.01)
(Continued)

(52) U.S. Cl.
CPC .............. *H02K 11/33* (2016.01); *B60K 6/26* (2013.01); *B60K 6/405* (2013.01); *H02K 5/18* (2013.01);
(Continued)

(58) Field of Classification Search
CPC .......... H02K 5/203; H02K 5/18; H02K 11/33; H02K 5/20; H02K 9/19; B60K 6/26;
(Continued)

(56) References Cited

U.S. PATENT DOCUMENTS 5,019,737 A * 5/1991 Bruno ...................... H02K 9/14
310/58
6,909,210 B1 * 6/2005 Bostwick ................. H02K 5/20
310/58
(Continued)

FOREIGN PATENT DOCUMENTS

CN  105464996 A * 4/2016 ......... F04D 13/0626
CN  205344509     6/2016
(Continued)

OTHER PUBLICATIONS

International Search Report for Application No. PCT/CN2017/102038 dated Jul. 2, 2018 (2 pages).

*Primary Examiner* — Alex W Mok
(74) *Attorney, Agent, or Firm* — Michael Best & Friedrich LLP (57) ABSTRACT

An electric motor and inverter assembly (100) used in an electric vehicle or a hybrid electric vehicle to drive the vehicle's wheels to rotate is disclosed. The electric motor and inverter assembly comprises: an electric motor (300), which includes a housing including a main shell (310), an end cover (320) and a connecting cover (330), wherein a cooling passage is formed in a wall of the housing such that coolant is able to flow in the cooling passage, and an end cover (320) and a connecting cover (330) are respectively connected to opposite ends of the main shell; and an inverter, which includes a housing (210) in which a power element and/or an electrical device is received, wherein the housing of the inverter contacts the connecting cover such that an interface is defined between the connecting cover and the
(Continued)

housing of the inverter, and the coolant flowing through the cooling passage is able to contact the interface.

13 Claims, 8 Drawing Sheets

(51) Int. Cl.
| | |
|---|---|
| *B60K 6/26* | (2007.10) |
| *B60K 6/405* | (2007.10) |
| *H02K 11/33* | (2016.01) |
| *H02K 9/19* | (2006.01) |
| *H02K 5/18* | (2006.01) |
| *B60K 1/00* | (2006.01) |

(52) U.S. Cl.
CPC .............. *H02K 5/203* (2021.01); *H02K 9/19* (2013.01); *H05K 7/20927* (2013.01); *B60K 2001/006* (2013.01); *B60Y 2200/91* (2013.01); *B60Y 2200/92* (2013.01); *B60Y 2400/60* (2013.01)

(58) Field of Classification Search
CPC .............. B60K 6/405; B60K 2001/006; H05K 7/20927; B60Y 2200/92; B60Y 2400/60; B60Y 2200/91; Y02T 10/64
USPC .......................................................... 310/52
See application file for complete search history.

(56) References Cited

U.S. PATENT DOCUMENTS

| | | | |
|---|---|---|---|
| 9,350,228 B2 * | 5/2016 | Uetake | H02M 1/44 |
| 9,531,242 B2 * | 12/2016 | Kulkarni | H02K 5/203 |
| 10,298,087 B2 * | 5/2019 | Chernogorski | H02K 5/203 |
| 2014/0077633 A1 | 3/2014 | Nagao et al. | |
| 2014/0183991 A1 * | 7/2014 | Kulkarni | H02K 9/19 |
| | | | 29/890.035 |

FOREIGN PATENT DOCUMENTS

| | | |
|---|---|---|
| CN | 106981954 | 7/2017 |
| JP | H0588185 U | 11/1993 |
| JP | H0727271 U | 5/1995 |
| JP | 2563562 Y2 * | 2/1998 |
| JP | H10225060 A | 8/1998 |
| JP | 2011182480 A | 9/2011 |
| WO | 2013069128 A1 | 5/2013 |
| WO | 2017058664 | 4/2017 |

* cited by examiner

ELECTRIC MOTOR AND INVERTER ASSEMBLY

BACKGROUND OF THE INVENTION

The present application generally relates to an electric motor integrated with an inverter.

At present, for the sake of environmental conservation, electric vehicles or hybrid electric vehicles have been widely and widely developed and used. An electric motor is used in the electric vehicle as a power supply unit. The electric motor is coupled to an inverter by which direct current from a power battery is converted into three-phase alternating current to drive the electric motor. An output shaft of the electric motor is usually coupled to a transmission device. The output shaft's rotating speed is lowered by the transmission device such that the electric vehicle's wheels can be driven to rotate.

In a conventional design of the electric vehicle, the electric motor, the inverter and the transmission device are independent from each other and usually have different housings. Therefore, when installed in the vehicle, they will occupy a large space. Moreover, it is possible that the electric motor and the inverter are separated from each other and are connected by an electrical cable and a bus-bar. Use of the long electrical cable and the bus-bar may not only increase assembling difficulty and affect maintenance, but also result in a possibility of failure. Therefore, a high degree integrated electric motor and inverter assembly is needed such that it will occupy a small space in the vehicle, and thus the assembling difficulty is decreased and the maintenance is facilitated.

Furthermore, a great amount of heat will produce when the electric motor and the inverter operate. Usually, a coolant flowing channel is provided in the housing of the electric motor such that the electric motor can be cooled down. However, under the influence of production process, the coolant flowing channel is usually not long and is provided non-uniformly around the housing such that the cooling performance of the electric motor is affected.

SUMMARY OF THE INVENTION

It is one object of the present application to provide an improved electric motor and inverter assembly which can occupy a smaller space and cooling of both the electric motor and the inverter can be considered.

According to one aspect, the present application proposes an electric motor and invert assembly used in an electric vehicle or a hybrid electric vehicle to drive the vehicle's wheels to rotate, said electric motor and invert assembly comprising: an electric motor, the electric motor including a housing, a cooling passage being formed in a wall of the housing such that coolant is able to flow in the cooling passage, the housing of the electric motor including a main shell, and an end cover and a connecting cover which are connected to opposite ends of the main shell; and an inverter, the inverter including a housing in which a power element and/or an electrical device is received, wherein the housing of the inverter contacts the connecting cover such that an interface is defined between the connecting cover and the housing of the inverter, and the coolant flowing through the cooling passage is able to contact the interface.

Optionally, after the coolant enters the housing of the electric motor, it flows first through the connecting cover and then through the main shell and the end cover.

Optionally, an output shaft of the electric motor extends through the end cover such that it protrudes partially outwards.

Optionally, the coolant is able to flow substantially over the entire longitudinal length of the main shell.

Optionally, the interface is formed by the housing of the inverter, and the connecting cover is formed with a groove in a side contacting the housing of the inverter such that the groove is in fluid communication with the cooling passage.

Optionally, the interface is formed by the connecting cover, and a groove is formed in the connecting cover such that the groove is in fluid communication with the cooling passage.

Optionally, the connecting cover comprises an additional cover plate which covers on the groove, and the interface is defined by the additional cover plate.

Optionally, mirror-symmetrical to said groove, a groove is formed in the housing of the inverter, and when the housing of the inverter is in contact with the connecting cover, the two grooves face each other.

Optionally, the groove of the connecting cover is substantially U-shaped.

Optionally, the main shell is substantially hollow cylinder shaped, and a plurality of separated channels are formed longitudinally in a cylindrical wall of the main shell such that the cooling passage is partially defined by the plurality of separated channels.

Optionally, a plurality of circumferentially separated grooves are formed in a side of the end cover facing the main shell and/or a plurality of circumferentially separated additional grooves are formed in a side of the connecting cover facing the main shell, such that the cooling passage is partially defined by the plurality of circumferentially separated grooves and/or the plurality of circumferentially separated additional grooves.

Optionally, a plurality of separated fins are provided in the channels of the main shell and/or the grooves of the end cover and/or the groove and/or the additional grooves of the connecting cover and/or the groove of the housing of the inverter.

Optionally, the fins of the main shell are elongated, each fin is longitudinally shorter than the main shell, and in each channel of the main shell, the fins extends radially and outwardly from a sidewall of the channel adjacent to the interior of the housing of the electric motor.

Optionally, the fins extend to or not to a radially opposing sidewall of the channel.

Optionally, a guide feature is additionally provided in the channel of the main shell, and the guide feature is adjacent to the end cover and/or the connecting cover such that the coolant turns smooth when flowing to the end cover and/or the connecting cover.

Optionally, a power adapter and a signal adapter are provided in the housing of the electric motor, and electric wires electrically connecting the power adapter and the signal adapter to the power element and/or the electrical device of the inverter respectively are arranged within the housing of the inverter and the housing of the electric motor.

According to technical solutions of the present application, the electric motor and the inverter can be integrated together in a more compact manner such that the space utilization in the vehicle's interior can be improved. Furthermore, because the cooling passage of the electric motor and inverter assembly can be used to cool both the electric motor and the inverter down, the inverter is ensured to be reliably cooled down during operation. The segmental design of the electric motor's housing ensures that the cooling passage can be made longer in the housing of the electric motor such that the cooling effect of the assembly can be further improved. Further, the design of the fins in the cooling passage can increase the area of contact between the coolant and the housing of the electric motor, resulting in a better cooling effect.

BRIEF DESCRIPTION OF THE DRAWINGS

The preceding and other aspects of the present application will be well understood by the following description in combination with the attached drawings. It should be noted that although the drawings may be given in different ratios, they cannot be thought to affect understanding to the present application. In the drawings:

FIG. 8b is a partially enlarging and perspective view relating to FIG. 8a.

DETAILED DESCRIPTION

In the drawings of the present application, features of the same configuration or having a similar function are represented by the same reference numerals.

Figure 1A:
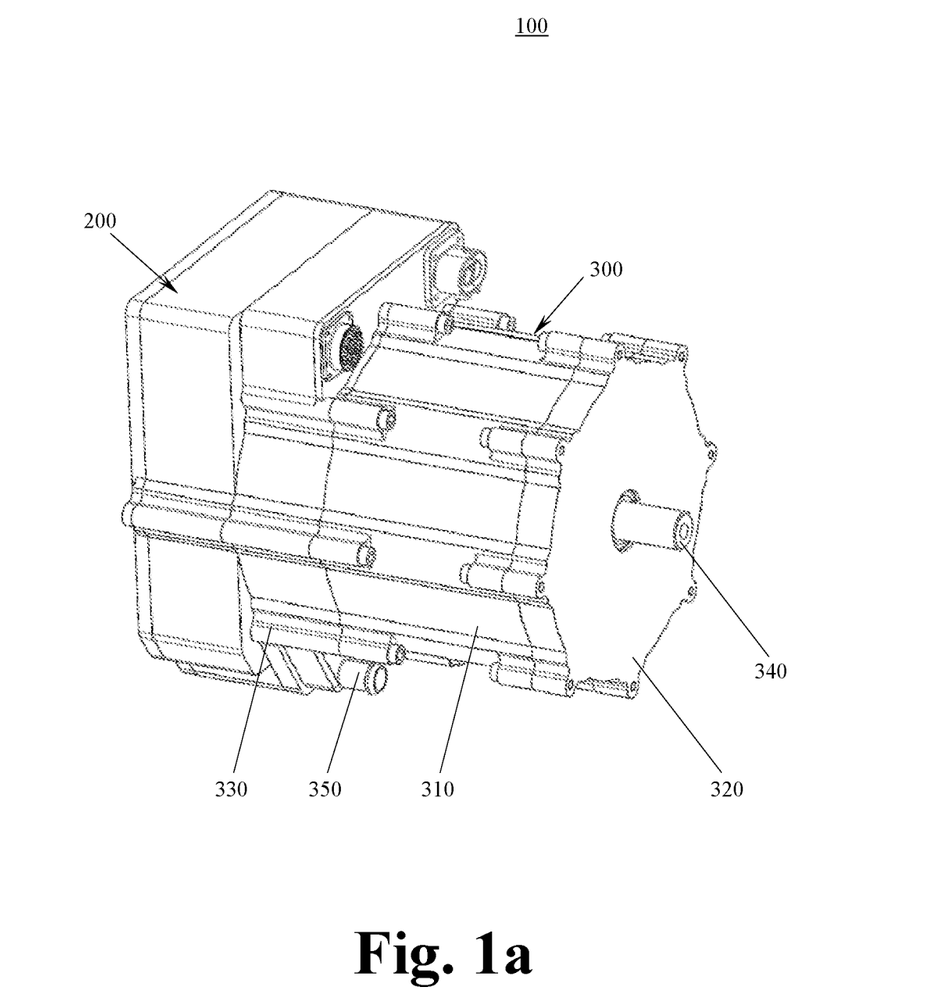
FIG. 1a is a perspective view schematically illustrating an electric motor and inverter assembly according to one embodiment of the present application.
Figure 1B:
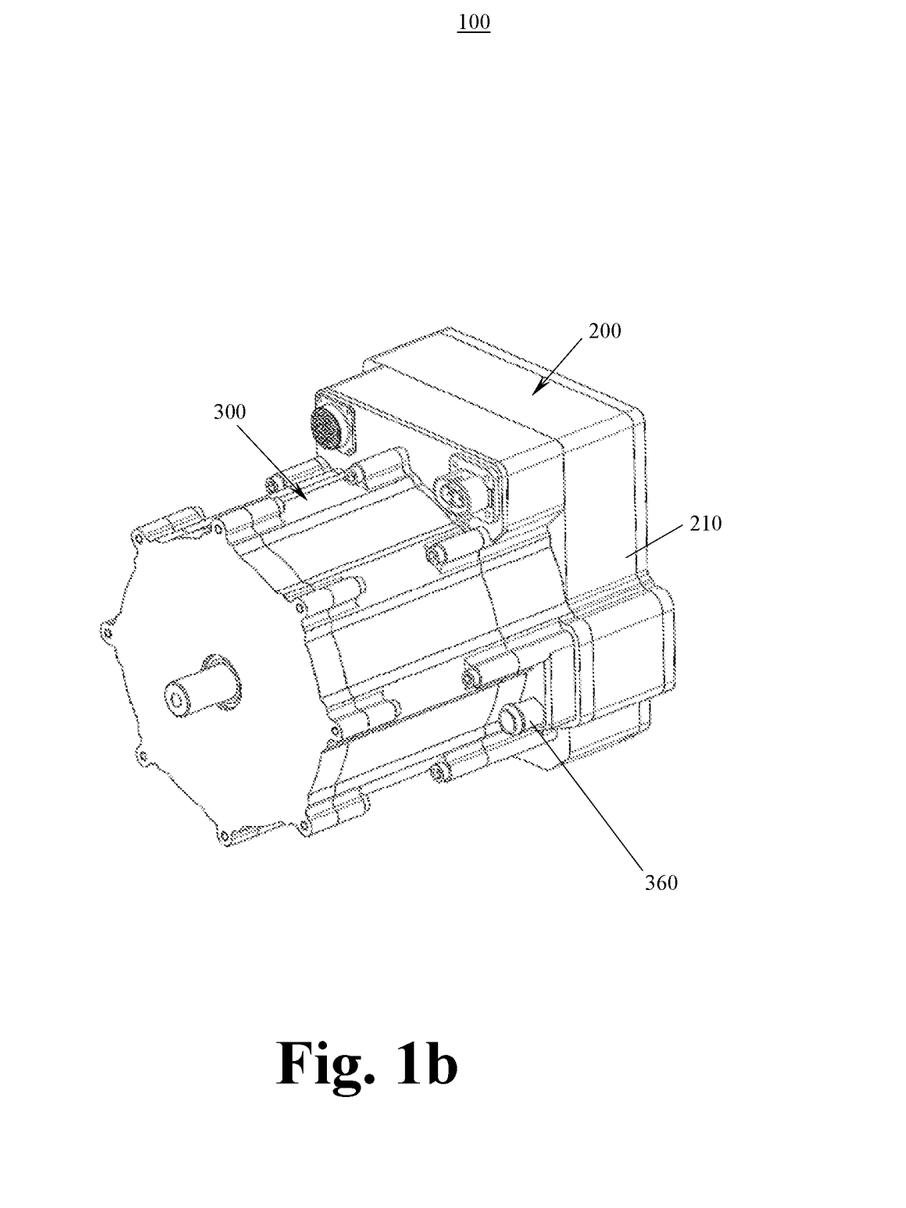
FIG. 1b is a perspective view schematically illustrating said electric motor and inverter assembly observed in another direction.

FIGS. 1a and 1b are perspective views schematically illustrating an electric motor and inverter assembly 100 according to one embodiment of the present application. In the context of the present application, the electric motor refers to an electric motor which is used in an electric vehicle or a hybrid electric vehicle to drive the vehicle's wheels or any other suitable electric motor. Usually, it is a three-phase electric motor.

As shown in FIGS. 1a and 1b, the assembly 100 comprises an electric motor 300 and an inverter 200. The electric motor 300 comprises a main shell 310 which is substantially hollow cylinder-shaped. The electric motor 300 also comprises an end cover 320 and a connecting cover 330. The main shell 310, the end cover 320 and the connecting cover 330 can be connected to each other by any suitable mechanical means such as bolts so as to constitute a housing of the electric motor 300. A rotor and a stator (not shown) are received in the housing of the electric motor 300. A motor shaft 340 fixedly-connected to the rotor extends partially outwards through the end cover 320.

It is understood by an ordinary person in the art that the motor shaft 340 of the electric motor 330 can be operatively coupled to a transmission device (not shown) such that the motor shaft's rotating speed can be lowered and thus the vehicle's wheels can be driven to rotate.

Each of the main shell 310, the end cover 320 and the connecting cover 330 is formed with a coolant flowing channel therein such that after the main shell 310, the end cover 320 and the connecting cover 330 are assembled together, the respective coolant flowing channels are connected to each other to generate a cooling passage. An inlet 350 and an outlet 360 are formed in the housing of the electric motor 300. The inlet 350 and the outlet 360 are in fluid communication with the cooling passage of the electric motor 300 such that coolant (liquids) can be pumped to flow through the whole cooling passage of the electric motor 300 via the inlet 350 and discharge out via the outlet 360. The coolant can be cycled as such to result in a cooling effect.

The inverter 200 comprises a housing 210 which is generally cubical. A power element and other electrical devices for controlling the electric motor are received in the housing 210. Opposite to the main shell 310, the inverter 200, for example its housing 210, is connected over an axial end side of the connecting cover 330. For example, both of them can be connected by bolts or any other suitable mechanical means.

Figure 2:
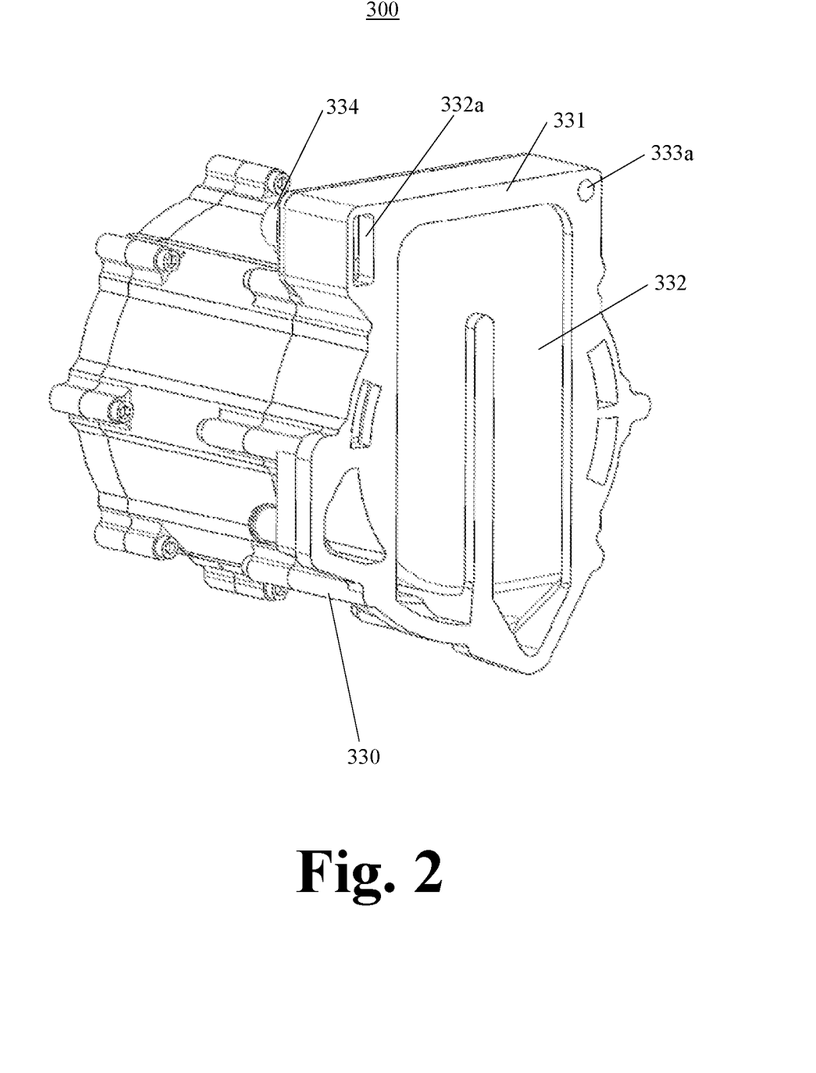
FIG. 2 is a perspective view schematically illustrating an electric motor without an inverter being assembled.
Figure 3:
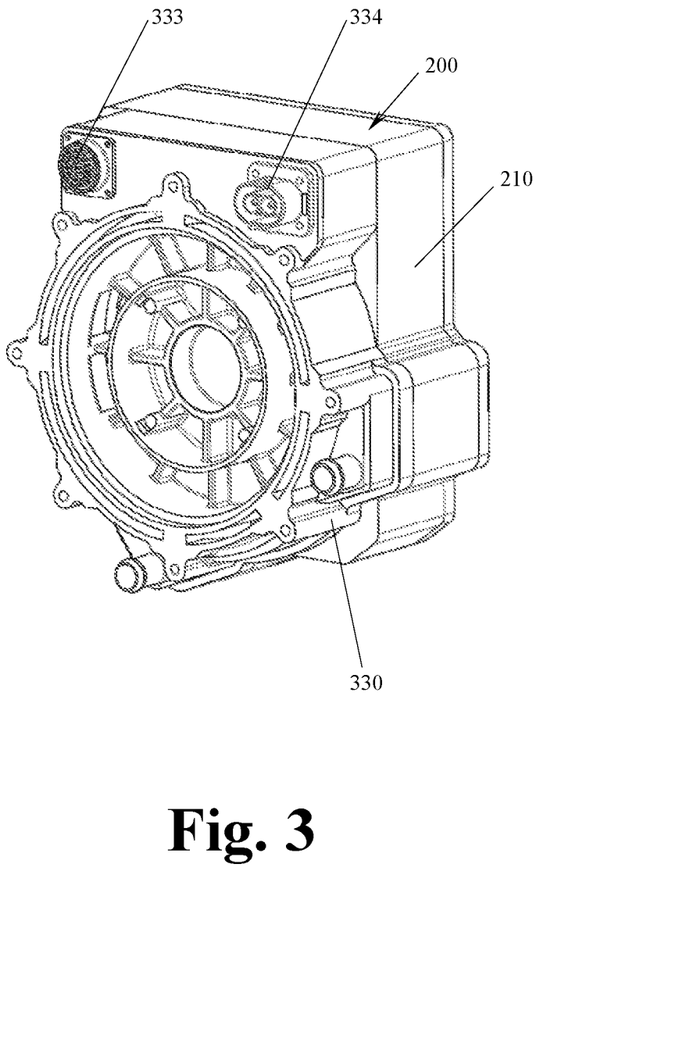
FIG. 3 is a partial and perspective view schematically illustrating said electric motor and inverter assembly.

Further, as shown in FIG. 2, a substantially U-shaped groove 332 is provided in the axial end side 331 of the connecting cover 330. The U-shaped groove 332 forms a part of the cooling passage of the electric motor 300. That is to say, after the assembly 100 is assembled, two branches of the U-shaped groove 332 are respectively in fluid communication with the inlet 350 and the outlet 360 of the electric motor 300. In the present application, the two branches of the U shape can be of different lengths. In order to maximize the cooling effect, the U-shaped groove 332 occupies substantially the majority of projection area on the axial end side 331. As shown in FIG. 3, when the inverter 200 is assembled on the connecting cover 330 in place, one side of the housing 210 of the inverter 200 is in contact with the end side 331 such that the coolant flowing through the groove 332 can contact the side of the housing 210. The side of the housing 210 defines an interface between the housing 210 and the connecting cover 330. Because heat emitting from the power element and the electrical devices received in the housing 210 can transfer to the interface, the coolant flowing over the interface can take away the heat such that the inverter 200 can be cooled down. In a preferred embodiment, the inlet 350 is provided in the housing of the electric motor 300 such that the coolant fed via the inlet 350 first enters the connecting cover 330, flows through the groove 332, and then flows in the main shell 310 and the end cover 320.

It should be understood by the ordinary person in the art that in order to ensure sealing, a leak-proof structure such as a gasket can be clamped between the connecting cover 330 and the inverter 200.

Figure 4:
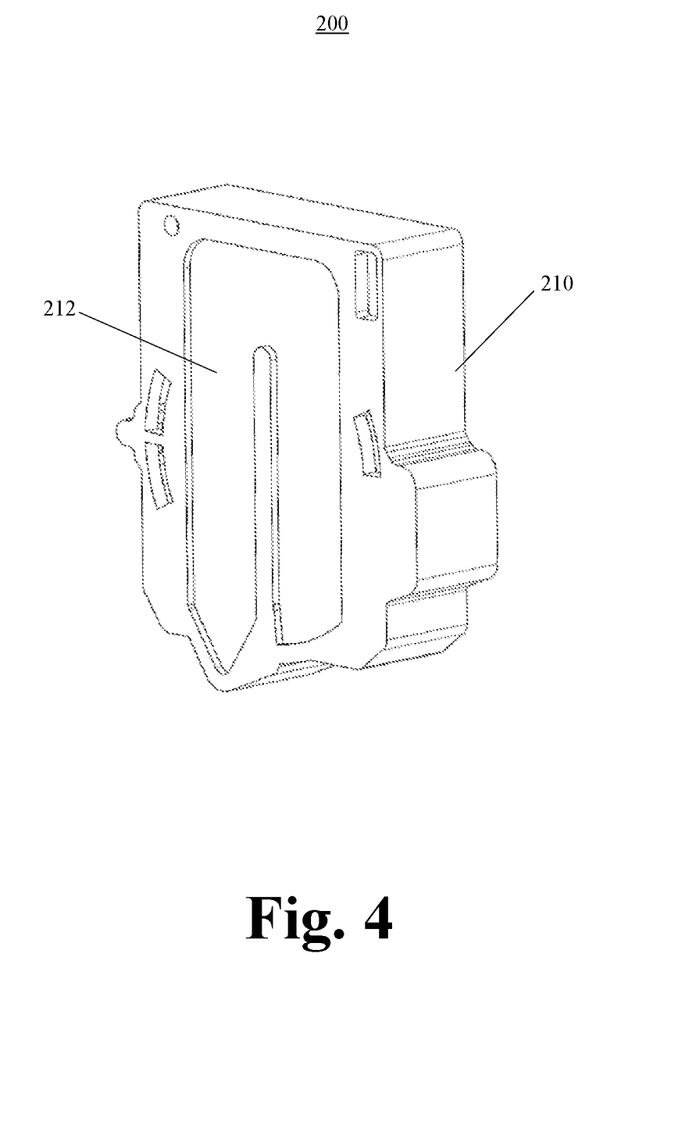
FIG. 4 is a perspective view schematically illustrating said inverter.

The side of the housing 210 of the inverter 200 tending to contact the end side 331 can be substantially planar. FIG. 4 schematically illustrates one optional embodiment of the housing 210 of the inverter 200. As shown, in this embodiment, the side of the housing 210 of the inverter 200 tending to contact the end side 331 is formed with a U-shaped groove 212 which is mirror-symmetrical to the U-shaped groove 332. In this way, when the inverter 200 is assembled on the connecting cover 330 in place, the two U-shaped grooves 212 and 332 will generate a U-shaped channel having a larger hollow cross-section such that more coolant per unit time can flow through the channel. Therefore, the electric motor 300 can be ensured to be effectively cooled down and in the meanwhile the inverter 200 can be also ensured to be effectively cooled down.

It should be understood by the ordinary person in the art that the channel between the inverter 200 and the connecting cover 330, through which the coolant can flow, is not limited to the U shape. Other shapes such as V or W are feasible as long as the channel can occupy the majority of projection area.

A power adapter 334 and a signal adapter 333 are provided in the connecting cover 330. The power adapter 334 is used to connect to a direct current power source such as a power battery such that the electric motor 300 is energized via the inverter 200. The signal adapter 333 is used to connect to a central control unit of the vehicle so as to control the inverter 200 and/or the electric motor 300. The connecting cover 330 is provided with openings 332a and 333a which are in communication with the power adapter 334 and the signal adapter 333 respectively. In this way, when the electric motor 300 is assembled together with the inverter 200, electric wires can be used to connect the power adapter 334 and the signal adapter 333 to relevant joints of the inverter 200 respectively. Then, the connecting cover 330 can be connected to the inverter 200 as mentioned previously such that the electric wires can be held in a space between the inverter 200 and the connecting cover 330. In an optional embodiment, the relevant joints of the inverter 200 and the power adapter 334 and the signal adapter 333 can be designed in a manner of plug and socket. In this way, the electric wires can be dispensed with, the relevant joints can be directly connected to the adapters when the connecting cover 330 is connected to the inverter 200, such that assembling work can be simplified.

Figure 5:
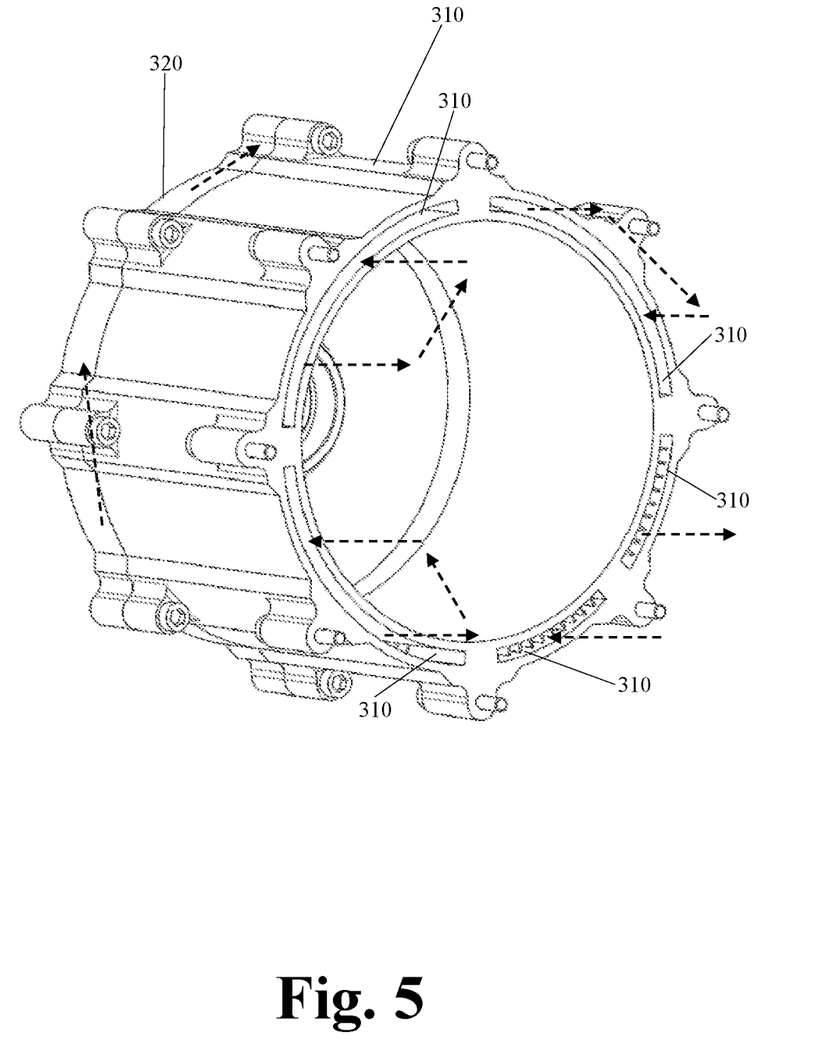
FIG. 5 is a perspective view schematically illustrating a part of the electric motor.
Figure 6:
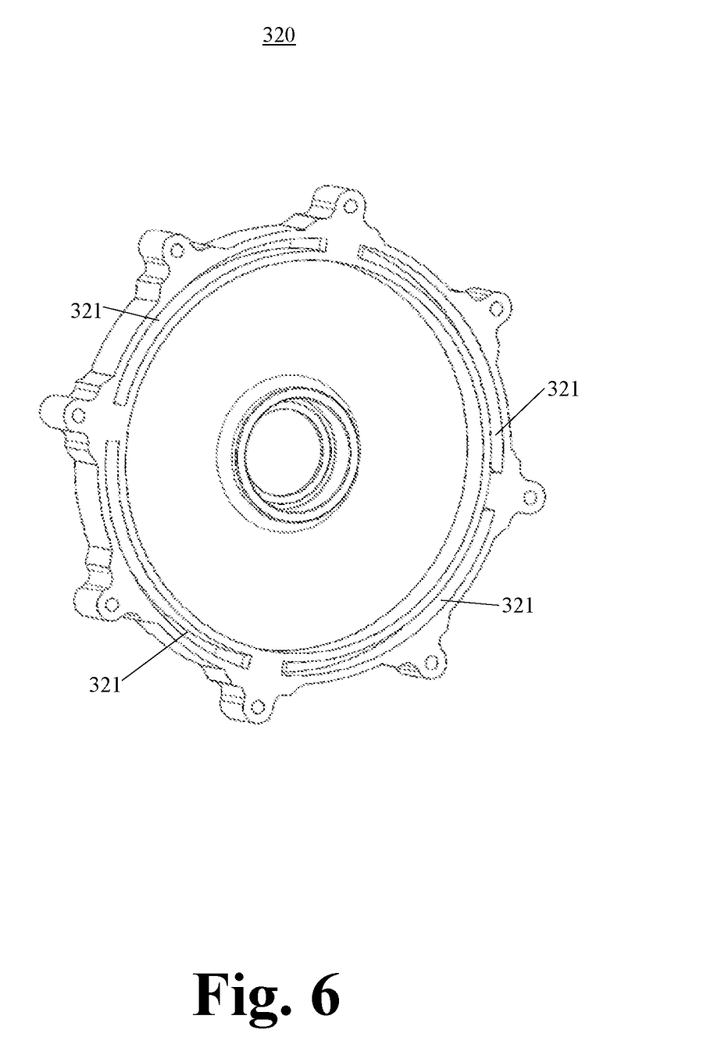
FIG. 6 is a perspective view schematically illustrating an end cover of the electric motor.

FIG. 5 is a perspective view schematically illustrating the main shell 310 assembled with the end cover 320. FIG. 6 is a perspective view schematically illustrating the end cover 320. A plurality of channels 311 are longitudinally formed in a cylindrical wall of the main shell 310 such that the channels are separated from each other. Five channels 311 are shown in FIG. 5. The channels 311 of the main shell 310 define the coolant flowing channel of the main shell 310. A plurality of grooves 321 are formed in the end cover 320 such that the grooves 321 are circumferentially separated from each other. Four grooves 321 are shown in FIG. 6. The grooves 321 of the end cover 320 define the coolant flowing channel of the end cover 320. At lease one channel 311 of the main shell 310 is in communication with the inlet 350 and the outlet 360 of the electric motor 300 for the coolant. Similar to the end cover 320, the connecting cover 330 is formed with a plurality of circumferentially separated grooves in a side facing the main shell 310. The grooves of the connecting cover 330 define the coolant flowing channel of the connecting cover 330. In this way, when the end cover 320, the main shell 310 and the connecting cover 330 are assembled to each other in place, the grooves 321 of the end cover 320 and the grooves of the connecting cover 330 connect the channels 311 of the main shell 310 in series such that the coolant can flow in the whole wall of the electric motor housing in a way as illustrated by arrows of FIG. 5. For instance, this can be achieved by circumferential misalignment of the grooves 321 of the end cover 320 and the grooves of the connecting cover 330 with the channels 331 of the main shell 310.

As explained already, the housing of the electric motor 300 is produced in a segmental manner and assembled. Therefore, the main shell 310 can be produced by extruding. Comparison with a housing of the electric motor 300 conventionally produced by casting, the cooling passage in the housing of the electric motor 300 according to the present application can be made longer. That is to say, more coolant per unit time can flow in the housing wall of the electric motor 300, resulting in a better cooling effect.

Figure 7:
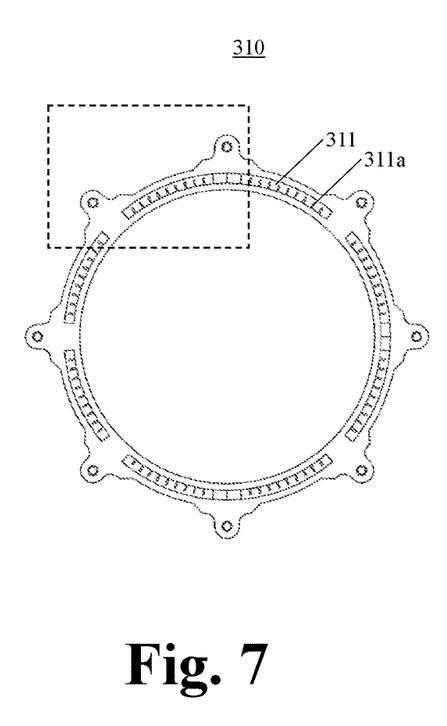
FIG. 7 is a cross-sectional view schematically illustrating a main shell of the electric motor.
Figure 8A:
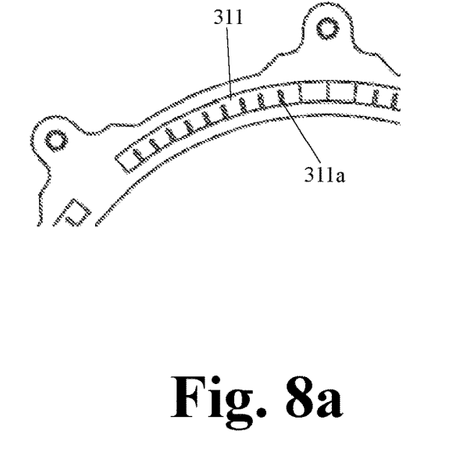
FIG. 8a is a partially enlarging view of FIG. 7.

FIG. 7 is a cross-sectional view schematically illustrating the main shell 310. It can be seen that a plurality of circumferentially separated fins 311a are provided in each of the channels 311 so as to increase the area of contact between the coolant and the main shell 310. Each fin 311a can be elongated. For example, the fins 311a can be shorter axially than the channels 311. FIG. 8a is a partially enlarging view schematically illustrating a dotted box of FIG. 7. It can be seen that in each channel 311 the fins 311a extends radially and outwardly from a sidewall of the channel 311 adjacent to the housing's interior. Alternatively, the fins 311a can extend to or not to a radially opposing sidewall of the channel 311. In this way, the existence of the fins 311a does not affect the flowability of the coolant in the channel 311 and increases the area of contact between the coolant and the shell.

Figure 8B:
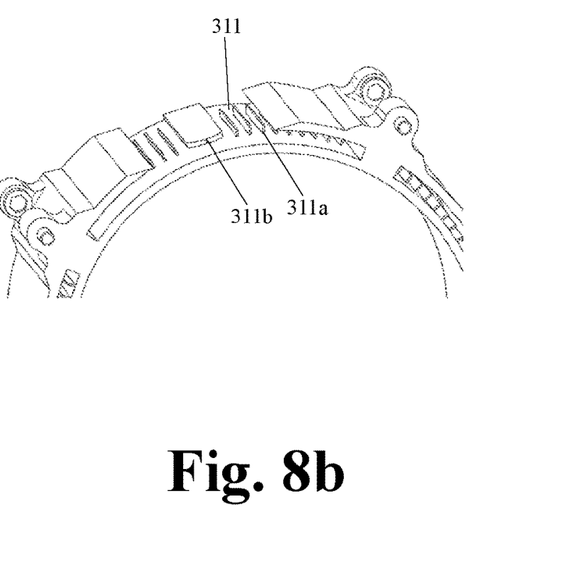

Take the main shell 310 and the end cover 320 for example. When the coolant flows to the groove 321 of the end cover 320 along the fins 311a in one channel 311, the coolant may turn by 180 degrees under attack, which may hinder the coolant to flow and thus negatively affect the cooling effect. In order to avoid such a hindering effect caused by sharp turning, an optional embodiment of the present application is illustrated by FIG. 8b. According to this optional embodiment, a guide feature 311b is provided in the channel 311 of the main shell 310 at a position adjacent to the end cover 320 and/or the connecting cover 330. For example, the guide feature 311b is substantially at a circumferential middle position in the channel 311 and is spaced from the adjacent fins 311a. The guide feature 311b has two rounded corners at both sides. In this way, when the coolant flowing along the adjacent fins 311b impacts the groove 321, the coolant, under the influence of the rounded corners of the guide feature 311b, will not turn sharply but turn smooth a little along the rounded corners of the guide feature 311b. Therefore, the velocity of flow of the coolant will not be decreased greatly such that the cooling effect of the electric motor 300 will not be affected.

In the embodiments of the present application, the fins and/or the guide feature can be integrally formed in the main shell 310 or alternatively can be soldered or otherwise connected to the main shell 310 as independent element(s). It should be understood by the ordinary person in the art that similar fins can be applied in the grooves 321 of the end cover 320 and/or the grooves of the connecting cover 330 defining the coolant flowing channel, such that the area of contact between the coolant and them can be increased to improve the cooling effect. For instance, a plurality of circumferentially separated fins can be provided in the groove 321 shown in FIG. 6 such that the fins extend radially and outwardly from a sidewall of the groove 321 adjacent to the housing's interior. Alternatively, the fins can extend to or not to a radially opposing sidewall of the groove 321. For instance again, in another optional embodiment, a plurality of separated fins can be provided in the U-shaped groove 332 of the connecting cover 330 and/or the U-shaped groove 212 of the housing 210 such that when the housing 210 is connected to the connecting cover 330, the respective fins will not contact each other, and the fins of the connecting cover 330 will not contact the housing 210 and the fins of the housing 210 will not contact the connecting cover 330. In this way, the area of the interface between the housing 210 and the connecting cover 330 is increased so as to increase the area of contact of the coolant and further to strengthen the cooling effect.

In the embodiment illustrated by FIGS. 3 and 4, the housing 210 of the inverter 200 is an enclosed housing in which the power element and the relevant electrical devices are received. In an alternative embodiment, the housing 210 of the inverter 200 can be a housing having an opening at one side, in which housing the power element and the relevant electrical devices are received. In this case, the grooves 332 of the connecting cover 330 can be closed by an additional cover plate such that when the opening side of the housing 210 of the inverter 200 is connected to the connecting cover 330, the additional cover plate defines the interface between the housing 210 and the connecting cover 330. Because the heat emitting from the power element and the electrical devices received in the housing 210 can transfer to the interface, the coolant flowing over the interface can take away the heat such that the inverter 200 can be cooled down. In order to strengthen the cooling effect, the additional cover plate can be provided with a plurality of fins on a side tending to contact the coolant.

Although in the already explained embodiments the inverter 200 is connected to the connecting cover 330 of the electric motor 300, it should be understood by the ordinary person in the art that the inverter 200 can be connected to any other suitable location of the electric motor 300, for example to an outer sidewall of the main shell 310, as long as a heat-transfer interface can be defined between the housing of the electric motor 300 and the housing of the inverter 200 to contact the coolant.

Although some specific embodiments of the present application have been described here, they are given for illustrative purpose only and cannot be deemed to constrain the scope of the present application. Various replacements, alternations and modifications can be thought out without departing from the spirit and scope of the present application.

What is claimed is:

1. An electric motor and inverter assembly (100) used in an electric vehicle or a hybrid electric vehicle to drive the vehicle's wheels to rotate, said electric motor and inverter assembly (100) comprising:
    an electric motor (300), the electric motor including a housing, a cooling passage being formed in a wall of the housing such that coolant is able to flow in the cooling passage, the housing of the electric motor (300) including a main shell (310), and an end cover (320) and a connecting cover (330) which are connected to opposite ends of the main shell (310); and
    an inverter (200), the inverter (200) including a housing (210) in which a power element and/or an electrical device is received, wherein the housing (210) of the inverter (200) contacts the connecting cover (330) such that an interface is defined between the connecting cover (330) and the housing of the inverter (200), and the coolant flowing through the cooling passage is able to contact the interface,
    wherein the connecting cover (330) includes a groove (332) formed in a side of the connecting cover (330) that contacts the housing (210) of the inverter (200) at the interface,
    wherein the groove (332) extends and is elongated along the interface and is in fluid communication with the cooling passage,
    wherein mirror-symmetrical to said groove (332), a groove (212) is formed in the housing (210) of the inverter (200), and
    wherein the groove (332) of the connecting cover (330) and the groove (212) formed in the housing (210) face each other and follow a path along the interface.

2. The electric motor and inverter assembly (100) as claimed in claim 1, wherein after entering the housing of the electric motor (300), the coolant flows first through the connecting cover (300) and then through the main shell (310) and the end cover (320).

3. The electric motor and inverter assembly (100) as claimed in claim 2, wherein the main shell (310) is substantially hollow cylinder shaped, and a plurality of separated channels (311) are formed longitudinally in a cylindrical wall of the main shell (310) such that the cooling passage is partially defined by the plurality of separated channels (311).

4. The electric motor and inverter assembly (100) as claimed in claim 3, wherein a plurality of separated fins are provided in the channels (311) of the main shell (310).

5. The electric motor and inverter assembly (100) as claimed in claim 4, wherein the fins (311a) of the main shell (310) are elongated, each fin (311a) is longitudinally shorter than the main shell (310), and in each channel (311) of the main shell (310), the fins (311a) extends radially and outwardly from a sidewall of the channel (311) adjacent to the interior of the housing of the electric motor (300).

6. The electric motor and inverter assembly (100) as claimed in claim 5, wherein the fins (311a) extend to or not to a radially opposing sidewall of the channel (311).

7. The electric motor and inverter assembly (100) as claimed in claim 4, wherein a guide feature (311b) is additionally provided in the channel (311) of the main shell (310), and the guide feature (311b) is adjacent to the end cover (320) and/or the connecting cover (330) such that the coolant turns smooth when flowing to the end cover (320) and/or the connecting cover (330).

8. The electric motor and inverter assembly (100) as claimed in claim 2, wherein a plurality of circumferentially separated grooves (321) are formed in a side of the end cover (320) facing the main shell (310) and/or a plurality of circumferentially separated additional grooves are formed in a side of the connecting cover (330) facing the main shell (310), such that the cooling passage is partially defined by the plurality of circumferentially separated grooves (321) and/or the plurality of circumferentially separated additional grooves.

9. The electric motor and inverter assembly (100) as claimed in claim 1, wherein an output shaft (340) of the electric motor (300) extends through the end cover (320) such that the output shaft protrudes partially outwards.

10. The electric motor and inverter assembly (100) as claimed in claim 1, wherein the groove (332) of the connecting cover (330) is substantially U-shaped.

11. The electric motor and inverter assembly (100) as claimed in claim 1, wherein the assembly is configured such that the coolant is able to flow substantially over the entire longitudinal length of the main shell (310).

12. The electric motor and inverter assembly (100) as claimed in claim 1, wherein a power adapter (334) and a signal adapter (333) are provided in the housing of the electric motor (300), and electric wires electrically connecting the power adapter (334) and the signal adapter (333) to the power element and/or the electrical device of the inverter respectively are arranged within the housing (210) of the inverter (200) and the housing of the electric motor (300).

13. The electric motor and inverter assembly (100) as claimed in claim 1, wherein the groove (332) of the connecting cover (330) is elongated in a direction perpendicular a centerline of an output shaft (340) of the electric motor (300).

\* \* \* \* \*